(12) United States Patent  (10) Patent No.: US 9,135,937 B1
Goulakov  (45) Date of Patent: Sep. 15, 2015

(54) CURRENT MODULATION ON LASER DIODE FOR ENERGY ASSISTED MAGNETIC RECORDING TRANSDUCER

(71) Applicant: Western Digital (Fremont), LLC, Fremont, CA (US)

(72) Inventor: Arkadi B. Goulakov, Fremont, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 0 days.

(21) Appl. No.: 14/461,595

(22) Filed: Aug. 18, 2014

Related U.S. Application Data

(60) Provisional application No. 61/991,295, filed on May 9, 2014.

(51) Int. Cl.
| | | |
|---|---|---|
| *G11B 11/00* | (2006.01) | |
| *G11B 5/48* | (2006.01) | |
| *H01S 5/068* | (2006.01) | |
| *H01S 5/062* | (2006.01) | |
| *G11B 5/00* | (2006.01) | |

(52) U.S. Cl.
CPC .............. *G11B 5/4866* (2013.01); *H01S 5/062* (2013.01); *H01S 5/06804* (2013.01); *G11B 2005/0021* (2013.01)

(58) Field of Classification Search
None
See application file for complete search history.

(56) References Cited

U.S. PATENT DOCUMENTS

| | | | |
|---|---|---|---|
| 3,974,507 A | * | 8/1976 | Chemelli et al. ............... 347/258 |
| 4,975,918 A | * | 12/1990 | Morton ............................ 372/20 |
| 6,016,290 A | | 1/2000 | Chen et al. |
| 6,018,441 A | | 1/2000 | Wu et al. |
| 6,025,978 A | | 2/2000 | Hoshi et al. |
| 6,025,988 A | | 2/2000 | Yan |
| 6,032,353 A | | 3/2000 | Hiner et al. |
| 6,033,532 A | | 3/2000 | Minami |
| 6,034,851 A | | 3/2000 | Zarouri et al. |
| 6,043,959 A | | 3/2000 | Crue et al. |
| 6,046,885 A | | 4/2000 | Aimonetti et al. |
| 6,049,650 A | | 4/2000 | Jerman et al. |
| 6,055,138 A | | 4/2000 | Shi |
| 6,058,094 A | | 5/2000 | Davis et al. |
| 6,073,338 A | | 6/2000 | Liu et al. |
| 6,078,479 A | | 6/2000 | Nepela et al. |
| 6,081,499 A | | 6/2000 | Berger et al. |
| 6,094,803 A | | 8/2000 | Carlson et al. |
| 6,099,362 A | | 8/2000 | Viches et al. |
| 6,103,073 A | | 8/2000 | Thayamballi |
| 6,108,166 A | | 8/2000 | Lederman |
| 6,118,629 A | | 9/2000 | Huai et al. |
| 6,118,638 A | | 9/2000 | Knapp et al. |
| 6,125,018 A | | 9/2000 | Takagishi et al. |
| 6,130,779 A | | 10/2000 | Carlson et al. |
| 6,134,089 A | | 10/2000 | Barr et al. |
| 6,136,166 A | | 10/2000 | Shen et al. |
| 6,137,661 A | | 10/2000 | Shi et al. |
| 6,137,662 A | | 10/2000 | Huai et al. |
| 6,160,684 A | | 12/2000 | Heist et al. |
| 6,163,426 A | | 12/2000 | Nepela et al. |
| 6,166,891 A | | 12/2000 | Lederman et al. |
| 6,173,486 B1 | | 1/2001 | Hsiao et al. |
| 6,175,476 B1 | | 1/2001 | Huai et al. |
| 6,178,066 B1 | | 1/2001 | Barr |
| 6,178,070 B1 | | 1/2001 | Hong et al. |

(Continued)

*Primary Examiner* — Tan X Dinh

(57) ABSTRACT

An apparatus includes a laser diode, a near field transducer configured to direct light emitted from the laser diode to a magnetic recording medium, and a power source configured to provide modulated current to the laser diode.

16 Claims, 5 Drawing Sheets

(56) References Cited

U.S. PATENT DOCUMENTS

| | | |
|---|---|---|
| 6,178,150 B1 | 1/2001 | Davis |
| 6,181,485 B1 | 1/2001 | He |
| 6,181,525 B1 | 1/2001 | Carlson |
| 6,185,051 B1 | 2/2001 | Chen et al. |
| 6,185,077 B1 | 2/2001 | Tong et al. |
| 6,185,081 B1 | 2/2001 | Simion et al. |
| 6,188,549 B1 | 2/2001 | Wiitala |
| 6,190,764 B1 | 2/2001 | Shi et al. |
| 6,193,584 B1 | 2/2001 | Rudy et al. |
| 6,195,229 B1 | 2/2001 | Shen et al. |
| 6,198,608 B1 | 3/2001 | Hong et al. |
| 6,198,609 B1 | 3/2001 | Barr et al. |
| 6,201,673 B1 | 3/2001 | Rottmayer et al. |
| 6,204,998 B1 | 3/2001 | Katz |
| 6,204,999 B1 | 3/2001 | Crue et al. |
| 6,212,153 B1 | 4/2001 | Chen et al. |
| 6,215,625 B1 | 4/2001 | Carlson |
| 6,219,205 B1 | 4/2001 | Yuan et al. |
| 6,221,218 B1 | 4/2001 | Shi et al. |
| 6,222,707 B1 | 4/2001 | Huai et al. |
| 6,229,782 B1 | 5/2001 | Wang et al. |
| 6,230,959 B1 | 5/2001 | Heist et al. |
| 6,233,116 B1 | 5/2001 | Chen et al. |
| 6,233,125 B1 | 5/2001 | Knapp et al. |
| 6,237,215 B1 | 5/2001 | Hunsaker et al. |
| 6,252,743 B1 | 6/2001 | Bozorgi |
| 6,255,721 B1 | 7/2001 | Roberts |
| 6,258,468 B1 | 7/2001 | Mahvan et al. |
| 6,266,216 B1 | 7/2001 | Hikami et al. |
| 6,271,604 B1 | 8/2001 | Frank, Jr. et al. |
| 6,275,354 B1 | 8/2001 | Huai et al. |
| 6,277,505 B1 | 8/2001 | Shi et al. |
| 6,282,056 B1 | 8/2001 | Feng et al. |
| 6,296,955 B1 | 10/2001 | Hossain et al. |
| 6,297,955 B1 | 10/2001 | Frank, Jr. et al. |
| 6,304,414 B1 | 10/2001 | Crue, Jr. et al. |
| 6,307,715 B1 | 10/2001 | Berding et al. |
| 6,310,746 B1 | 10/2001 | Hawwa et al. |
| 6,310,750 B1 | 10/2001 | Hawwa et al. |
| 6,317,290 B1 | 11/2001 | Wang et al. |
| 6,317,297 B1 | 11/2001 | Tong et al. |
| 6,322,911 B1 | 11/2001 | Fukagawa et al. |
| 6,330,136 B1 | 12/2001 | Wang et al. |
| 6,330,137 B1 | 12/2001 | Knapp et al. |
| 6,333,830 B2 | 12/2001 | Rose et al. |
| 6,340,533 B1 | 1/2002 | Ueno et al. |
| 6,349,014 B1 | 2/2002 | Crue, Jr. et al. |
| 6,351,355 B1 | 2/2002 | Min et al. |
| 6,353,318 B1 | 3/2002 | Sin et al. |
| 6,353,511 B1 | 3/2002 | Shi et al. |
| 6,356,412 B1 | 3/2002 | Levi et al. |
| 6,359,779 B1 | 3/2002 | Frank, Jr. et al. |
| 6,369,983 B1 | 4/2002 | Hong |
| 6,376,964 B1 | 4/2002 | Young et al. |
| 6,377,535 B1 | 4/2002 | Chen et al. |
| 6,381,095 B1 | 4/2002 | Sin et al. |
| 6,381,105 B1 | 4/2002 | Huai et al. |
| 6,389,499 B1 | 5/2002 | Frank, Jr. et al. |
| 6,392,850 B1 | 5/2002 | Tong et al. |
| 6,396,660 B1 | 5/2002 | Jensen et al. |
| 6,399,179 B1 | 6/2002 | Hanrahan et al. |
| 6,400,526 B2 | 6/2002 | Crue, Jr. et al. |
| 6,404,600 B1 | 6/2002 | Hawwa et al. |
| 6,404,601 B1 | 6/2002 | Rottmayer et al. |
| 6,404,706 B1 | 6/2002 | Stovall et al. |
| 6,410,170 B1 | 6/2002 | Chen et al. |
| 6,411,522 B1 | 6/2002 | Frank, Jr. et al. |
| 6,417,998 B1 | 7/2002 | Crue, Jr. et al. |
| 6,417,999 B1 | 7/2002 | Knapp et al. |
| 6,418,000 B1 | 7/2002 | Gibbons et al. |
| 6,418,048 B1 | 7/2002 | Sin et al. |
| 6,421,211 B1 | 7/2002 | Hawwa et al. |
| 6,421,212 B1 | 7/2002 | Gibbons et al. |
| 6,424,505 B1 | 7/2002 | Lam et al. |
| 6,424,507 B1 | 7/2002 | Lederman et al. |
| 6,430,009 B1 | 8/2002 | Komaki et al. |
| 6,430,806 B1 | 8/2002 | Chen et al. |
| 6,433,965 B1 | 8/2002 | Gopinathan et al. |
| 6,433,968 B1 | 8/2002 | Shi et al. |
| 6,433,970 B1 | 8/2002 | Knapp et al. |
| 6,437,945 B1 | 8/2002 | Hawwa et al. |
| 6,445,536 B1 | 9/2002 | Rudy et al. |
| 6,445,542 B1 | 9/2002 | Levi et al. |
| 6,445,553 B2 | 9/2002 | Barr et al. |
| 6,445,554 B1 | 9/2002 | Dong et al. |
| 6,447,935 B1 | 9/2002 | Zhang et al. |
| 6,448,765 B1 | 9/2002 | Chen et al. |
| 6,451,514 B1 | 9/2002 | Iitsuka |
| 6,452,742 B1 | 9/2002 | Crue et al. |
| 6,452,765 B1 | 9/2002 | Mahvan et al. |
| 6,456,465 B1 | 9/2002 | Louis et al. |
| 6,459,552 B1 | 10/2002 | Liu et al. |
| 6,462,920 B1 | 10/2002 | Karimi |
| 6,466,401 B1 | 10/2002 | Hong et al. |
| 6,466,402 B1 | 10/2002 | Crue, Jr. et al. |
| 6,466,404 B1 | 10/2002 | Crue, Jr. et al. |
| 6,468,436 B1 | 10/2002 | Shi et al. |
| 6,469,877 B1 | 10/2002 | Knapp et al. |
| 6,477,019 B2 | 11/2002 | Matono et al. |
| 6,479,096 B1 | 11/2002 | Shi et al. |
| 6,483,662 B1 | 11/2002 | Thomas et al. |
| 6,487,040 B1 | 11/2002 | Hsiao et al. |
| 6,487,056 B1 | 11/2002 | Gibbons et al. |
| 6,490,125 B1 | 12/2002 | Barr |
| 6,496,330 B1 | 12/2002 | Crue, Jr. et al. |
| 6,496,334 B1 | 12/2002 | Pang et al. |
| 6,504,676 B1 | 1/2003 | Hiner et al. |
| 6,512,657 B2 | 1/2003 | Heist et al. |
| 6,512,659 B1 | 1/2003 | Hawwa et al. |
| 6,512,661 B1 | 1/2003 | Louis |
| 6,512,690 B1 | 1/2003 | Qi et al. |
| 6,515,573 B1 | 2/2003 | Dong et al. |
| 6,515,791 B1 | 2/2003 | Hawwa et al. |
| 6,532,823 B1 | 3/2003 | Knapp et al. |
| 6,535,363 B1 | 3/2003 | Hosomi et al. |
| 6,552,874 B1 | 4/2003 | Chen et al. |
| 6,552,928 B1 | 4/2003 | Qi et al. |
| 6,577,470 B1 | 6/2003 | Rumpler |
| 6,583,961 B2 | 6/2003 | Levi et al. |
| 6,583,968 B1 | 6/2003 | Scura et al. |
| 6,597,548 B1 | 7/2003 | Yamanaka et al. |
| 6,611,398 B1 | 8/2003 | Rumpler et al. |
| 6,618,223 B1 | 9/2003 | Chen et al. |
| 6,629,357 B1 | 10/2003 | Akoh |
| 6,633,464 B2 | 10/2003 | Lai et al. |
| 6,636,394 B1 | 10/2003 | Fukagawa et al. |
| 6,639,291 B1 | 10/2003 | Sin et al. |
| 6,650,503 B1 | 11/2003 | Chen et al. |
| 6,650,506 B1 | 11/2003 | Risse |
| 6,654,195 B1 | 11/2003 | Frank, Jr. et al. |
| 6,657,816 B1 | 12/2003 | Barr et al. |
| 6,661,621 B1 | 12/2003 | Iitsuka |
| 6,661,625 B1 | 12/2003 | Sin et al. |
| 6,674,610 B1 | 1/2004 | Thomas et al. |
| 6,680,863 B1 | 1/2004 | Shi et al. |
| 6,683,763 B1 | 1/2004 | Hiner et al. |
| 6,687,098 B1 | 2/2004 | Huai |
| 6,687,178 B1 | 2/2004 | Qi et al. |
| 6,687,977 B2 | 2/2004 | Knapp et al. |
| 6,691,226 B1 | 2/2004 | Frank, Jr. et al. |
| 6,697,294 B1 | 2/2004 | Qi et al. |
| 6,700,738 B1 | 3/2004 | Sin et al. |
| 6,700,759 B1 | 3/2004 | Knapp et al. |
| 6,704,158 B2 | 3/2004 | Hawwa et al. |
| 6,707,083 B1 | 3/2004 | Hiner et al. |
| 6,713,801 B1 | 3/2004 | Sin et al. |
| 6,721,138 B1 | 4/2004 | Chen et al. |
| 6,721,149 B1 | 4/2004 | Shi et al. |
| 6,721,203 B1 | 4/2004 | Qi et al. |
| 6,724,569 B1 | 4/2004 | Chen et al. |
| 6,724,572 B1 | 4/2004 | Stoev et al. |
| 6,729,015 B2 | 5/2004 | Matono et al. |
| 6,735,850 B1 | 5/2004 | Gibbons et al. |
| 6,737,281 B1 | 5/2004 | Dang et al. |

(56) References Cited

U.S. PATENT DOCUMENTS

| | | |
|---|---|---|
| 6,737,664 B2 | 5/2004 | Bretney et al. |
| 6,744,608 B1 | 6/2004 | Sin et al. |
| 6,747,301 B1 | 6/2004 | Hiner et al. |
| 6,751,055 B1 | 6/2004 | Alfoqaha et al. |
| 6,754,049 B1 | 6/2004 | Seagle et al. |
| 6,756,071 B1 | 6/2004 | Shi et al. |
| 6,757,140 B1 | 6/2004 | Hawwa |
| 6,760,196 B1 | 7/2004 | Niu et al. |
| 6,762,910 B1 | 7/2004 | Knapp et al. |
| 6,765,756 B1 | 7/2004 | Hong et al. |
| 6,775,902 B1 | 8/2004 | Huai et al. |
| 6,778,358 B1 | 8/2004 | Jiang et al. |
| 6,781,927 B1 | 8/2004 | Heanuc et al. |
| 6,785,955 B1 | 9/2004 | Chen et al. |
| 6,791,793 B1 | 9/2004 | Chen et al. |
| 6,791,807 B1 | 9/2004 | Hikami et al. |
| 6,798,616 B1 | 9/2004 | Seagle et al. |
| 6,798,625 B1 | 9/2004 | Ueno et al. |
| 6,801,408 B1 | 10/2004 | Chen et al. |
| 6,801,411 B1 | 10/2004 | Lederman et al. |
| 6,803,615 B1 | 10/2004 | Sin et al. |
| 6,806,035 B1 | 10/2004 | Atireklapvarodom et al. |
| 6,807,030 B1 | 10/2004 | Hawwa et al. |
| 6,807,332 B1 | 10/2004 | Hawwa |
| 6,809,899 B1 | 10/2004 | Chen et al. |
| 6,816,345 B1 | 11/2004 | Knapp et al. |
| 6,828,897 B1 | 12/2004 | Nepela |
| 6,829,160 B1 | 12/2004 | Qi et al. |
| 6,829,819 B1 | 12/2004 | Crue, Jr. et al. |
| 6,833,979 B1 | 12/2004 | Knapp et al. |
| 6,834,010 B1 | 12/2004 | Qi et al. |
| 6,859,343 B1 | 2/2005 | Alfoqaha et al. |
| 6,859,997 B1 | 3/2005 | Tong et al. |
| 6,861,937 B1 | 3/2005 | Feng et al. |
| 6,870,712 B2 | 3/2005 | Chen et al. |
| 6,873,494 B2 | 3/2005 | Chen et al. |
| 6,873,547 B1 | 3/2005 | Shi et al. |
| 6,879,464 B2 | 4/2005 | Sun et al. |
| 6,888,184 B1 | 5/2005 | Shi et al. |
| 6,888,704 B1 | 5/2005 | Diao et al. |
| 6,891,702 B1 | 5/2005 | Tang |
| 6,894,871 B2 | 5/2005 | Alfoqaha et al. |
| 6,894,877 B1 | 5/2005 | Crue, Jr. et al. |
| 6,906,894 B2 | 6/2005 | Chen et al. |
| 6,909,578 B1 | 6/2005 | Missell et al. |
| 6,912,106 B1 | 6/2005 | Chen et al. |
| 6,934,113 B1 | 8/2005 | Chen |
| 6,934,129 B1 | 8/2005 | Zhang et al. |
| 6,940,688 B2 | 9/2005 | Jiang et al. |
| 6,942,824 B1 | 9/2005 | Li |
| 6,943,993 B2 | 9/2005 | Chang et al. |
| 6,944,938 B1 | 9/2005 | Crue, Jr. et al. |
| 6,947,258 B1 | 9/2005 | Li |
| 6,950,266 B1 | 9/2005 | McCaslin et al. |
| 6,954,332 B1 | 10/2005 | Hong et al. |
| 6,958,885 B1 | 10/2005 | Chen et al. |
| 6,961,221 B1 | 11/2005 | Niu et al. |
| 6,969,989 B1 | 11/2005 | Mei |
| 6,975,486 B2 | 12/2005 | Chen et al. |
| 6,987,643 B1 | 1/2006 | Seagle |
| 6,989,962 B1 | 1/2006 | Dong et al. |
| 6,989,972 B1 | 1/2006 | Stoev et al. |
| 7,006,327 B2 | 2/2006 | Krounbi et al. |
| 7,007,372 B1 | 3/2006 | Chen et al. |
| 7,012,832 B1 | 3/2006 | Sin et al. |
| 7,023,658 B1 | 4/2006 | Knapp et al. |
| 7,026,063 B2 | 4/2006 | Ueno et al. |
| 7,027,268 B1 | 4/2006 | Zhu et al. |
| 7,027,274 B1 | 4/2006 | Sin et al. |
| 7,035,046 B1 | 4/2006 | Young et al. |
| 7,041,985 B1 | 5/2006 | Wang et al. |
| 7,046,490 B1 | 5/2006 | Ueno et al. |
| 7,054,113 B1 | 5/2006 | Seagle et al. |
| 7,057,857 B1 | 6/2006 | Niu et al. |
| 7,059,868 B1 | 6/2006 | Yan |
| 7,092,195 B1 | 8/2006 | Liu et al. |
| 7,110,289 B1 | 9/2006 | Sin et al. |
| 7,111,382 B1 | 9/2006 | Knapp et al. |
| 7,113,366 B1 | 9/2006 | Wang et al. |
| 7,114,241 B2 | 10/2006 | Kubota et al. |
| 7,116,517 B1 | 10/2006 | He et al. |
| 7,124,654 B1 | 10/2006 | Davies et al. |
| 7,126,788 B1 | 10/2006 | Liu et al. |
| 7,126,790 B1 | 10/2006 | Liu et al. |
| 7,131,346 B1 | 11/2006 | Buttar et al. |
| 7,133,253 B1 | 11/2006 | Seagle et al. |
| 7,134,185 B1 | 11/2006 | Knapp et al. |
| 7,154,715 B2 | 12/2006 | Yamanaka et al. |
| 7,170,725 B1 | 1/2007 | Zhou et al. |
| 7,177,117 B1 | 2/2007 | Jiang et al. |
| 7,193,815 B1 | 3/2007 | Stoev et al. |
| 7,196,880 B1 | 3/2007 | Anderson et al. |
| 7,199,974 B1 | 4/2007 | Alfoqaha |
| 7,199,975 B1 | 4/2007 | Pan |
| 7,211,339 B1 | 5/2007 | Seagle et al. |
| 7,212,384 B1 | 5/2007 | Stoev et al. |
| 7,238,292 B1 | 7/2007 | He et al. |
| 7,239,478 B1 | 7/2007 | Sin et al. |
| 7,248,431 B1 | 7/2007 | Liu et al. |
| 7,248,433 B1 | 7/2007 | Stoev et al. |
| 7,248,449 B1 | 7/2007 | Seagle |
| 7,280,325 B1 | 10/2007 | Pan |
| 7,283,327 B1 | 10/2007 | Liu et al. |
| 7,284,316 B1 | 10/2007 | Huai et al. |
| 7,286,329 B1 | 10/2007 | Chen et al. |
| 7,289,303 B1 | 10/2007 | Sin et al. |
| 7,292,409 B1 | 11/2007 | Stoev et al. |
| 7,296,339 B1 | 11/2007 | Yang et al. |
| 7,307,814 B1 | 12/2007 | Seagle et al. |
| 7,307,818 B1 | 12/2007 | Park et al. |
| 7,310,204 B1 | 12/2007 | Stoev et al. |
| 7,318,947 B1 | 1/2008 | Park et al. |
| 7,333,295 B1 | 2/2008 | Medina et al. |
| 7,337,530 B1 | 3/2008 | Stoev et al. |
| 7,342,752 B1 | 3/2008 | Zhang et al. |
| 7,349,170 B1 | 3/2008 | Rudman et al. |
| 7,349,179 B1 | 3/2008 | He et al. |
| 7,354,664 B1 | 4/2008 | Jiang et al. |
| 7,363,697 B1 | 4/2008 | Dunn et al. |
| 7,371,152 B1 | 5/2008 | Newman |
| 7,372,665 B1 | 5/2008 | Stoev et al. |
| 7,375,926 B1 | 5/2008 | Stoev et al. |
| 7,379,269 B1 | 5/2008 | Krounbi et al. |
| 7,386,933 B1 | 6/2008 | Krounbi et al. |
| 7,389,577 B1 | 6/2008 | Shang et al. |
| 7,417,832 B1 | 8/2008 | Erickson et al. |
| 7,419,891 B1 | 9/2008 | Chen et al. |
| 7,428,124 B1 | 9/2008 | Song et al. |
| 7,430,098 B1 | 9/2008 | Song et al. |
| 7,436,620 B1 | 10/2008 | Kang et al. |
| 7,436,638 B1 | 10/2008 | Pan |
| 7,440,220 B1 | 10/2008 | Kang et al. |
| 7,443,632 B1 | 10/2008 | Stoev et al. |
| 7,444,740 B1 | 11/2008 | Chung et al. |
| 7,468,998 B2 | 12/2008 | Luo et al. |
| 7,493,688 B1 | 2/2009 | Wang et al. |
| 7,508,627 B1 | 3/2009 | Zhang et al. |
| 7,522,377 B1 | 4/2009 | Jiang et al. |
| 7,522,379 B1 | 4/2009 | Krounbi et al. |
| 7,522,382 B1 | 4/2009 | Pan |
| 7,542,246 B1 | 6/2009 | Song et al. |
| 7,551,406 B1 | 6/2009 | Thomas et al. |
| 7,552,523 B1 | 6/2009 | He et al. |
| 7,554,767 B1 | 6/2009 | Hu et al. |
| 7,583,466 B2 | 9/2009 | Kermiche et al. |
| 7,595,967 B1 | 9/2009 | Moon et al. |
| 7,606,273 B1 | 10/2009 | Zhu et al. |
| 7,639,457 B1 | 12/2009 | Chen et al. |
| 7,660,080 B1 | 2/2010 | Liu et al. |
| 7,672,080 B1 | 3/2010 | Tang et al. |
| 7,672,086 B1 | 3/2010 | Jiang |
| 7,684,160 B1 | 3/2010 | Erickson et al. |
| 7,688,546 B1 | 3/2010 | Bai et al. |
| 7,691,434 B1 | 4/2010 | Zhang et al. |

(56) References Cited

U.S. PATENT DOCUMENTS

| | | |
|---|---|---|
| 7,695,761 B1 | 4/2010 | Shen et al. |
| 7,719,795 B2 | 5/2010 | Hu et al. |
| 7,726,009 B1 | 6/2010 | Liu et al. |
| 7,729,086 B1 | 6/2010 | Song et al. |
| 7,729,087 B1 | 6/2010 | Stoev et al. |
| 7,736,823 B1 | 6/2010 | Wang et al. |
| 7,785,666 B1 | 8/2010 | Sun et al. |
| 7,796,356 B1 | 9/2010 | Fowler et al. |
| 7,800,858 B1 | 9/2010 | Bajikar et al. |
| 7,819,979 B1 | 10/2010 | Chen et al. |
| 7,829,264 B1 | 11/2010 | Wang et al. |
| 7,846,643 B1 | 12/2010 | Sun et al. |
| 7,855,854 B2 | 12/2010 | Hu et al. |
| 7,869,160 B1 | 1/2011 | Pan et al. |
| 7,872,824 B1 | 1/2011 | Macchioni et al. |
| 7,872,833 B2 | 1/2011 | Hu et al. |
| 7,910,267 B1 | 3/2011 | Zeng et al. |
| 7,911,735 B1 | 3/2011 | Sin et al. |
| 7,911,737 B1 | 3/2011 | Jiang et al. |
| 7,916,426 B2 | 3/2011 | Hu et al. |
| 7,918,013 B1 | 4/2011 | Dunn et al. |
| 7,968,219 B1 | 6/2011 | Jiang et al. |
| 7,982,989 B1 | 7/2011 | Shi et al. |
| 8,008,912 B1 | 8/2011 | Shang |
| 8,012,804 B1 | 9/2011 | Wang et al. |
| 8,015,692 B1 | 9/2011 | Zhang et al. |
| 8,018,677 B1 | 9/2011 | Chung et al. |
| 8,018,678 B1 | 9/2011 | Zhang et al. |
| 8,024,748 B1 | 9/2011 | Moravec et al. |
| 8,072,705 B1 | 12/2011 | Wang et al. |
| 8,074,345 B1 | 12/2011 | Anguelouch et al. |
| 8,077,418 B1 | 12/2011 | Hu et al. |
| 8,077,434 B1 | 12/2011 | Shen et al. |
| 8,077,435 B1 | 12/2011 | Liu et al. |
| 8,077,557 B1 | 12/2011 | Hu et al. |
| 8,079,135 B1 | 12/2011 | Shen et al. |
| 8,081,403 B1 | 12/2011 | Chen et al. |
| 8,091,210 B1 | 1/2012 | Sasaki et al. |
| 8,097,846 B1 | 1/2012 | Anguelouch et al. |
| 8,104,166 B1 | 1/2012 | Zhang et al. |
| 8,116,043 B2 | 2/2012 | Leng et al. |
| 8,116,171 B1 | 2/2012 | Lee |
| 8,125,856 B1 | 2/2012 | Li et al. |
| 8,134,794 B1 | 3/2012 | Wang |
| 8,136,224 B1 | 3/2012 | Sun et al. |
| 8,136,225 B1 | 3/2012 | Zhang et al. |
| 8,136,805 B1 | 3/2012 | Lee |
| 8,141,235 B1 | 3/2012 | Zhang |
| 8,146,236 B1 | 4/2012 | Luo et al. |
| 8,149,536 B1 | 4/2012 | Yang et al. |
| 8,151,441 B1 | 4/2012 | Rudy et al. |
| 8,163,185 B1 | 4/2012 | Sun et al. |
| 8,164,760 B2 | 4/2012 | Willis |
| 8,164,855 B1 | 4/2012 | Gibbons et al. |
| 8,164,864 B2 | 4/2012 | Kaiser et al. |
| 8,165,709 B1 | 4/2012 | Rudy |
| 8,166,631 B1 | 5/2012 | Tran et al. |
| 8,166,632 B1 | 5/2012 | Zhang et al. |
| 8,169,473 B1 | 5/2012 | Yu et al. |
| 8,171,618 B1 | 5/2012 | Wang et al. |
| 8,179,636 B1 | 5/2012 | Bai et al. |
| 8,191,237 B1 | 6/2012 | Luo et al. |
| 8,194,365 B1 | 6/2012 | Leng et al. |
| 8,194,366 B1 | 6/2012 | Li et al. |
| 8,196,285 B1 | 6/2012 | Zhang et al. |
| 8,200,054 B1 | 6/2012 | Li et al. |
| 8,203,800 B2 | 6/2012 | Li et al. |
| 8,208,350 B1 | 6/2012 | Hu et al. |
| 8,220,140 B1 | 7/2012 | Wang et al. |
| 8,222,599 B1 | 7/2012 | Chien |
| 8,225,488 B1 | 7/2012 | Zhang et al. |
| 8,227,023 B1 | 7/2012 | Liu et al. |
| 8,228,633 B1 | 7/2012 | Tran et al. |
| 8,231,796 B1 | 7/2012 | Li et al. |
| 8,233,248 B1 | 7/2012 | Li et al. |
| 8,248,896 B1 | 8/2012 | Yuan et al. |
| 8,254,060 B1 | 8/2012 | Shi et al. |
| 8,257,597 B1 | 9/2012 | Guan et al. |
| 8,259,410 B1 | 9/2012 | Bai et al. |
| 8,259,539 B1 | 9/2012 | Hu et al. |
| 8,262,918 B1 | 9/2012 | Li et al. |
| 8,262,919 B1 | 9/2012 | Luo et al. |
| 8,264,797 B2 | 9/2012 | Emley |
| 8,264,798 B1 | 9/2012 | Guan et al. |
| 8,270,126 B1 | 9/2012 | Roy et al. |
| 8,276,258 B1 | 10/2012 | Tran et al. |
| 8,277,669 B1 | 10/2012 | Chen et al. |
| 8,279,719 B1 | 10/2012 | Hu et al. |
| 8,284,517 B1 | 10/2012 | Sun et al. |
| 8,288,204 B1 | 10/2012 | Wang et al. |
| 8,289,821 B1 | 10/2012 | Huber |
| 8,291,743 B1 | 10/2012 | Shi et al. |
| 8,307,539 B1 | 11/2012 | Rudy et al. |
| 8,307,540 B1 | 11/2012 | Tran et al. |
| 8,308,921 B1 | 11/2012 | Hiner et al. |
| 8,310,785 B1 | 11/2012 | Zhang et al. |
| 8,310,901 B1 | 11/2012 | Batra et al. |
| 8,315,019 B1 | 11/2012 | Mao et al. |
| 8,316,527 B2 | 11/2012 | Hong et al. |
| 8,320,076 B1 | 11/2012 | Shen et al. |
| 8,320,077 B1 | 11/2012 | Tang et al. |
| 8,320,219 B1 | 11/2012 | Wolf et al. |
| 8,320,220 B1 | 11/2012 | Yuan et al. |
| 8,320,722 B1 | 11/2012 | Yuan et al. |
| 8,322,022 B1 | 12/2012 | Yi et al. |
| 8,322,023 B1 | 12/2012 | Zeng et al. |
| 8,325,569 B1 | 12/2012 | Shi et al. |
| 8,333,008 B1 | 12/2012 | Sin et al. |
| 8,334,093 B2 | 12/2012 | Zhang et al. |
| 8,336,194 B2 | 12/2012 | Yuan et al. |
| 8,339,738 B1 | 12/2012 | Tran et al. |
| 8,341,826 B1 | 1/2013 | Jiang et al. |
| 8,343,319 B1 | 1/2013 | Li et al. |
| 8,343,364 B1 | 1/2013 | Gao et al. |
| 8,349,195 B1 | 1/2013 | Si et al. |
| 8,351,307 B1 | 1/2013 | Wolf et al. |
| 8,357,244 B1 | 1/2013 | Zhao et al. |
| 8,373,945 B1 | 2/2013 | Luo et al. |
| 8,375,564 B1 | 2/2013 | Luo et al. |
| 8,375,565 B2 | 2/2013 | Hu et al. |
| 8,381,391 B2 | 2/2013 | Park et al. |
| 8,385,157 B1 | 2/2013 | Champion et al. |
| 8,385,158 B1 | 2/2013 | Hu et al. |
| 8,394,280 B1 | 3/2013 | Wan et al. |
| 8,400,731 B1 | 3/2013 | Li et al. |
| 8,404,128 B1 | 3/2013 | Zhang et al. |
| 8,404,129 B1 | 3/2013 | Luo et al. |
| 8,405,930 B1 | 3/2013 | Li et al. |
| 8,409,453 B1 | 4/2013 | Jiang et al. |
| 8,413,317 B1 | 4/2013 | Wan et al. |
| 8,416,540 B1 | 4/2013 | Li et al. |
| 8,419,953 B1 | 4/2013 | Su et al. |
| 8,419,954 B1 | 4/2013 | Chen et al. |
| 8,422,176 B1 | 4/2013 | Leng et al. |
| 8,422,342 B1 | 4/2013 | Lee |
| 8,422,841 B1 | 4/2013 | Shi et al. |
| 8,424,192 B1 | 4/2013 | Yang et al. |
| 8,441,756 B1 | 5/2013 | Sun et al. |
| 8,443,510 B1 | 5/2013 | Shi et al. |
| 8,444,866 B1 | 5/2013 | Guan et al. |
| 8,449,948 B2 | 5/2013 | Medina et al. |
| 8,451,556 B1 | 5/2013 | Wang et al. |
| 8,451,563 B1 | 5/2013 | Zhang et al. |
| 8,454,846 B1 | 6/2013 | Zhou et al. |
| 8,455,119 B1 | 6/2013 | Jiang et al. |
| 8,456,961 B1 | 6/2013 | Wang et al. |
| 8,456,963 B1 | 6/2013 | Hu et al. |
| 8,456,964 B1 | 6/2013 | Yuan et al. |
| 8,456,966 B1 | 6/2013 | Shi et al. |
| 8,456,967 B1 | 6/2013 | Mallary |
| 8,458,892 B2 | 6/2013 | Si et al. |
| 8,462,592 B1 | 6/2013 | Wolf et al. |
| 8,468,682 B1 | 6/2013 | Zhang |
| 8,472,288 B1 | 6/2013 | Wolf et al. |

(56) References Cited

U.S. PATENT DOCUMENTS

| | | | |
|---|---|---|---|
| 8,480,911 | B1 | 7/2013 | Osugi et al. |
| 8,486,285 | B2 | 7/2013 | Zhou et al. |
| 8,486,286 | B1 | 7/2013 | Gao et al. |
| 8,488,272 | B1 | 7/2013 | Tran et al. |
| 8,491,801 | B1 | 7/2013 | Tanner et al. |
| 8,491,802 | B1 | 7/2013 | Gao et al. |
| 8,493,693 | B1 | 7/2013 | Zheng et al. |
| 8,493,695 | B1 | 7/2013 | Kaiser et al. |
| 8,495,813 | B1 | 7/2013 | Hu et al. |
| 8,498,084 | B1 | 7/2013 | Leng et al. |
| 8,506,828 | B1 | 8/2013 | Osugi et al. |
| 8,514,517 | B1 | 8/2013 | Batra et al. |
| 8,518,279 | B1 | 8/2013 | Wang et al. |
| 8,518,832 | B1 | 8/2013 | Yang et al. |
| 8,520,336 | B1 | 8/2013 | Liu et al. |
| 8,520,337 | B1 | 8/2013 | Liu et al. |
| 8,524,068 | B2 | 9/2013 | Medina et al. |
| 8,526,275 | B1 | 9/2013 | Yuan et al. |
| 8,531,801 | B1 | 9/2013 | Xiao et al. |
| 8,532,450 | B1 | 9/2013 | Wang et al. |
| 8,533,937 | B1 | 9/2013 | Wang et al. |
| 8,537,494 | B1 | 9/2013 | Pan et al. |
| 8,537,495 | B1 | 9/2013 | Luo et al. |
| 8,537,502 | B1 | 9/2013 | Park et al. |
| 8,545,999 | B1 | 10/2013 | Leng et al. |
| 8,547,659 | B1 | 10/2013 | Bai et al. |
| 8,547,667 | B1 | 10/2013 | Roy et al. |
| 8,547,730 | B1 | 10/2013 | Shen et al. |
| 8,555,486 | B1 | 10/2013 | Medina et al. |
| 8,559,141 | B1 | 10/2013 | Pakala et al. |
| 8,563,146 | B1 | 10/2013 | Zhang et al. |
| 8,565,049 | B1 | 10/2013 | Tanner et al. |
| 8,576,517 | B1 | 11/2013 | Tran et al. |
| 8,578,594 | B2 | 11/2013 | Jiang et al. |
| 8,582,238 | B1 | 11/2013 | Liu et al. |
| 8,582,241 | B1 | 11/2013 | Yu et al. |
| 8,582,253 | B1 | 11/2013 | Zheng et al. |
| 8,588,039 | B1 | 11/2013 | Shi et al. |
| 8,593,914 | B2 | 11/2013 | Wang et al. |
| 8,597,528 | B1 | 12/2013 | Roy et al. |
| 8,599,520 | B1 | 12/2013 | Liu et al. |
| 8,599,657 | B1 | 12/2013 | Lee |
| 8,603,593 | B1 | 12/2013 | Roy et al. |
| 8,607,438 | B1 | 12/2013 | Gao et al. |
| 8,607,439 | B1 | 12/2013 | Wang et al. |
| 8,611,035 | B1 | 12/2013 | Bajikar et al. |
| 8,611,054 | B1 | 12/2013 | Shang et al. |
| 8,611,055 | B1 | 12/2013 | Pakala et al. |
| 8,614,864 | B1 | 12/2013 | Hong et al. |
| 8,619,512 | B1 | 12/2013 | Yuan et al. |
| 8,625,233 | B1 | 1/2014 | Ji et al. |
| 8,625,941 | B1 | 1/2014 | Shi et al. |
| 8,628,672 | B1 | 1/2014 | Si et al. |
| 8,630,068 | B1 | 1/2014 | Mauri et al. |
| 8,634,280 | B1 | 1/2014 | Wang et al. |
| 8,638,529 | B1 | 1/2014 | Leng et al. |
| 8,643,980 | B1 | 2/2014 | Fowler et al. |
| 8,649,123 | B1 | 2/2014 | Zhang et al. |
| 8,665,561 | B1 | 3/2014 | Knutson et al. |
| 8,670,211 | B1 | 3/2014 | Sun et al. |
| 8,670,213 | B1 | 3/2014 | Zeng et al. |
| 8,670,214 | B1 | 3/2014 | Knutson et al. |
| 8,670,294 | B1 | 3/2014 | Shi et al. |
| 8,670,295 | B1 | 3/2014 | Hu et al. |
| 8,675,318 | B1 | 3/2014 | Ho et al. |
| 8,675,455 | B1 | 3/2014 | Krichevsky et al. |
| 8,681,594 | B1 | 3/2014 | Shi et al. |
| 8,689,430 | B1 | 4/2014 | Chen et al. |
| 8,693,141 | B1 | 4/2014 | Elliott et al. |
| 8,703,397 | B1 | 4/2014 | Zeng et al. |
| 8,705,205 | B1 | 4/2014 | Li et al. |
| 8,711,518 | B1 | 4/2014 | Zeng et al. |
| 8,711,528 | B1 | 4/2014 | Xiao et al. |
| 8,717,709 | B1 | 5/2014 | Shi et al. |
| 8,720,044 | B1 | 5/2014 | Tran et al. |
| 8,721,902 | B1 | 5/2014 | Wang et al. |
| 8,724,259 | B1 | 5/2014 | Liu et al. |
| 8,749,790 | B1 | 6/2014 | Tanner et al. |
| 8,749,920 | B1 | 6/2014 | Knutson et al. |
| 8,753,903 | B1 * | 6/2014 | Tanner et al. .................. 438/16 |
| 8,760,807 | B1 | 6/2014 | Zhang et al. |
| 8,760,818 | B1 | 6/2014 | Diao et al. |
| 8,760,819 | B1 | 6/2014 | Liu et al. |
| 8,760,822 | B1 | 6/2014 | Li et al. |
| 8,760,823 | B1 | 6/2014 | Chen et al. |
| 8,763,235 | B1 | 7/2014 | Wang et al. |
| 8,780,498 | B1 | 7/2014 | Jiang et al. |
| 8,780,505 | B1 | 7/2014 | Xiao |
| 8,786,983 | B1 | 7/2014 | Liu et al. |
| 8,790,524 | B1 | 7/2014 | Luo et al. |
| 8,790,527 | B1 | 7/2014 | Luo et al. |
| 8,792,208 | B1 | 7/2014 | Liu et al. |
| 8,792,312 | B1 | 7/2014 | Wang et al. |
| 8,793,866 | B1 | 8/2014 | Zhang et al. |
| 8,797,680 | B1 | 8/2014 | Luo et al. |
| 8,797,684 | B1 | 8/2014 | Tran et al. |
| 8,797,686 | B1 | 8/2014 | Bai et al. |
| 8,797,692 | B1 | 8/2014 | Guo et al. |
| 8,813,324 | B2 | 8/2014 | Emley et al. |
| 8,861,317 | B1 * | 10/2014 | Yan et al. .................. 369/13.33 |
| 2007/0258494 | A1 | 11/2007 | Davies et al. |
| 2008/0002157 | A1 * | 1/2008 | Bang et al. ..................... 353/69 |
| 2010/0290157 | A1 | 11/2010 | Zhang et al. |
| 2011/0086240 | A1 | 4/2011 | Xiang et al. |
| 2012/0111826 | A1 | 5/2012 | Chen et al. |
| 2012/0216378 | A1 | 8/2012 | Emley et al. |
| 2012/0237878 | A1 | 9/2012 | Zeng et al. |
| 2012/0298621 | A1 | 11/2012 | Gao |
| 2013/0216702 | A1 | 8/2013 | Kaiser et al. |
| 2013/0216863 | A1 | 8/2013 | Li et al. |
| 2013/0257421 | A1 | 10/2013 | Shang et al. |
| 2013/0286802 | A1 * | 10/2013 | Kiely .......................... 369/13.31 |
| 2013/0286805 | A1 * | 10/2013 | Macken et al. ............ 369/13.33 |
| 2014/0154529 | A1 | 6/2014 | Yang et al. |
| 2014/0175050 | A1 | 6/2014 | Zhang et al. |
| 2014/0269819 | A1 * | 9/2014 | Kiely et al. ................ 369/13.24 |

* cited by examiner

CURRENT MODULATION ON LASER DIODE FOR ENERGY ASSISTED MAGNETIC RECORDING TRANSDUCER

CROSS-REFERENCE TO RELATED APPLICATION

This application claims the benefit of U.S. Provisional Application Ser. No. 61/991,295 filed on May 9, 2014, which is expressly incorporated by reference herein in its entirety.

BACKGROUND

High density storage disks are configured with layers of materials that provide the required data stability for storage. The magnetic properties of the media require a softening when writing to the disk to change the bit state. Energy Assisted Magnetic Recording (EAMR) device or Heat Assisted Magnetic Recording (HAMR) technology provides heat that is focused on a nano-sized bit region when writing onto a magnetic storage disk, which achieves the magnetic softening. A light waveguide directs light from a laser diode to a near field transducer (NFT). The NFT focuses the optical energy to a small spot on the target recording area which heats the magnetic storage disk during a write operation.

EAMR/HAMR uses a controlled magnitude of laser diode power for the magnetic softening at the disk. During operation with temperature and current change, the laser diode gain spectrum shifts causing laser mode hops. Because different longitudinal modes have different spectral positions, the power magnitude changes, which creates recording noise. The delta between longitudinal modes is particularly significant in a case of optical feedback from optical elements located at a distance greater than 100 microns from the laser diode facet. For example, the laser diode may receive reflection from a near field transducer and the magnetic storage disk, which will have different phase shift for different modes, such that laser power will change with mode hopping.

BRIEF DESCRIPTION OF THE DRAWINGS

Various aspects of the present invention will now be presented in the detailed description by way of example, and not by way of limitation, with reference to the accompanying drawings, wherein.

DETAILED DESCRIPTION

Figure 1:
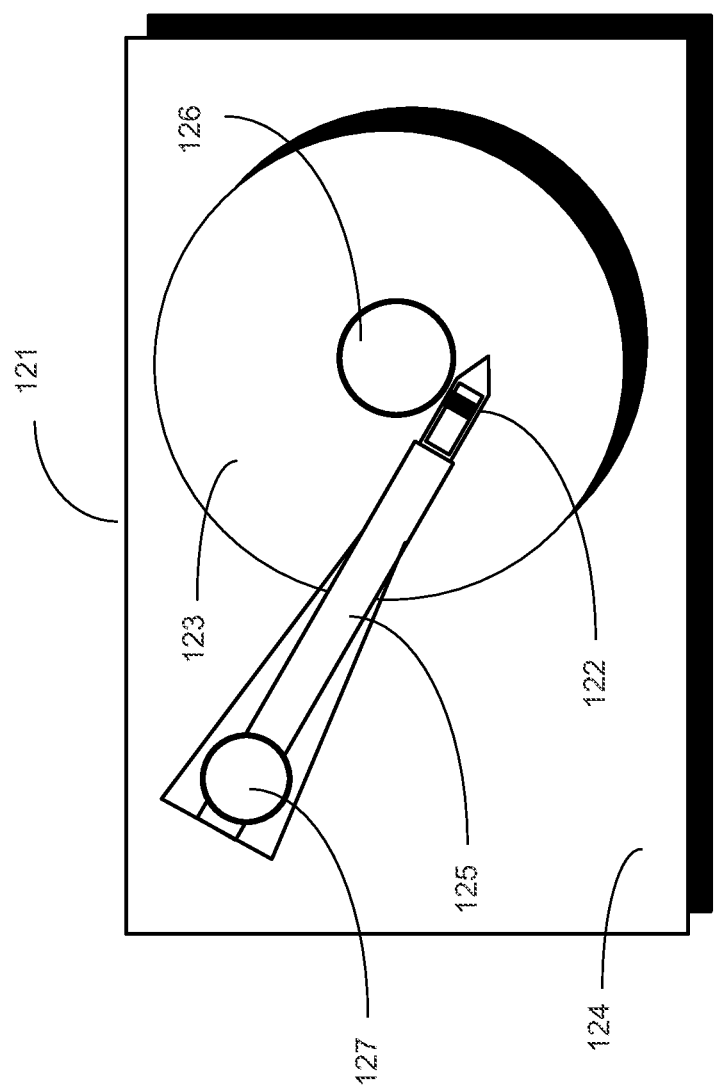
FIG. 1 shows an exemplary implementation of a laser diode in an EAMR enhanced disk-based drive.

The detailed description set forth below in connection with the appended drawings is intended as a description of various exemplary embodiments and is not intended to represent the only embodiments that may be practiced. The detailed description includes specific details for the purpose of providing a thorough understanding of the embodiments. However, it will be apparent to those skilled in the art that the embodiments may be practiced without these specific details. In some instances, well-known structures and components are shown in block diagram form in order to avoid obscuring the concepts of the embodiments. Acronyms and other descriptive terminology may be used merely for convenience and clarity and are not intended to limit the scope of the embodiments.

The various exemplary embodiments illustrated in the drawings may not be drawn to scale. Rather, the dimensions of the various features may be expanded or reduced for clarity. In addition, some of the drawings may be simplified for clarity. Thus, the drawings may not depict all of the components of a given apparatus.

Various embodiments will be described herein with reference to drawings that are schematic illustrations of idealized configurations. As such, variations from the shapes of the illustrations as a result of manufacturing techniques and/or tolerances, for example, are to be expected. Thus, the various embodiments presented throughout this disclosure should not be construed as limited to the particular shapes of elements illustrated and described herein but are to include deviations in shapes that result, for example, from manufacturing. By way of example, an element illustrated or described as having rounded or curved features at its edges may instead have straight edges. Thus, the elements illustrated in the drawings are schematic in nature and their shapes are not intended to illustrate the precise shape of an element and are not intended to limit the scope of the described embodiments.

The word "exemplary" is used herein to mean serving as an example, instance, or illustration. Any embodiment described herein as "exemplary" is not necessarily to be construed as preferred or advantageous over other embodiments. Likewise, the term "embodiment" of an apparatus or method does not require that all embodiments include the described components, structure, features, functionality, processes, advantages, benefits, or modes of operation. As used herein, the term "about" followed by a numeric value means within engineering tolerance of the provided value.

An apparatus includes a laser diode, coupled to the near field transducer. The laser diode has a current modulation source for stabilizing laser power during mode shifts. The laser diode may further include a first contact and a second contact to receive a first current modulation current and a second current modulation current, respectively. The first modulation current may be substantially out of phase with the second modulation current.

In the following detailed description, various aspects of the present invention will be presented in the context of a laser diode control configuration that may be used with a near field transducer for energy assisted magnetic recording on a magnetic storage disk. Various embodiments are well suited to an apparatus and methods for controlling mode shifts of a laser diode. However, those skilled in the art will realize that these aspects may be extended to controlling a laser diode for other purposes and arrangements. For example, various embodiments may be used in the context of devices related to optical media and optical data transmissions. Accordingly, any reference to a specific laser diode apparatus or method is intended only to illustrate the various embodiments, with the understanding that such embodiments may have a wide range of applications.

In one aspect, an apparatus includes a laser diode, a near field transducer configured to direct light emitted from the laser diode to a magnetic storage disk, and a power source configured to provide modulated current to the laser diode.

FIG. 1 shows a diagram of an exemplary implementation of a laser diode in an EAMR enhanced disk-based drive 121, which includes a disk drive base 124, at least one storage disk 123 (such as a magnetic disk, magneto-optical disk, or optical disk), a spindle motor 126 attached to the base 124 for rotating the disk 123. The spindle motor 126 typically includes a rotating hub on which disks are mounted and clamped. Rotation of the spindle motor hub results in rotation of the mounted disks 123. At least one actuator arm 125 supports at least one head gimbal assembly (HGA) 122 that includes a magnetic head assembly with writing and reading heads on a slider. For the EAMR/HAMR enhanced disk-based drive, a near field transducer (NFT) is included on an air bearing surface of the slider as well. During a recording operation of the disk-based drive 121, the actuator arm 125 rotates at the pivot 127 to position the HGA 122 to a desired information track on the disk 123. As the writer head performs the magnetic recording at the desired information track, a laser diode coupled to the NFT supplies a laser for magnetic softening of a nano-sized bit space on the disk.

Figure 2:
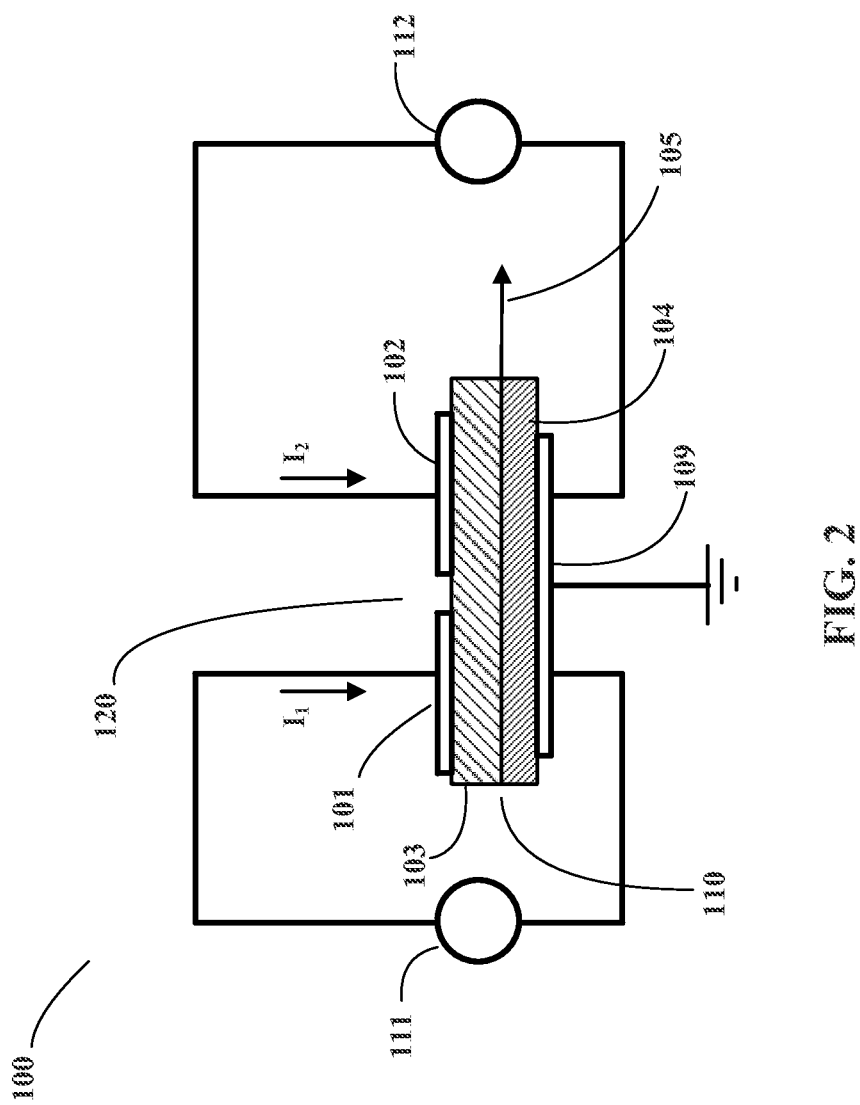
FIG. 2 shows an exemplary embodiment of a laser diode having two contact sections for supplying two separate current modulations.

FIG. 2 shows a diagram of an exemplary embodiment of an apparatus 100 that includes a laser diode 120 having two separate contacts 101 and 102 connected to current modulation sources 111 and 112, respectively. The laser diode 120 is grounded by a ground contact 109. The laser diode 120 includes a p-type semiconductor 103 and an n-type semiconductor 104, with laser output 105 transmitted longitudinally from the p-n junction. Current modulation source 111 drives a current $I_1$ through contact 101, across p-n junction 110 and to ground contact 109. The size and position of contact 101 controls the length of p-n junction 110 energized by current $I_1$, which may be defined as a first section of the diode 100. Current modulation source 112 drives a current $I_2$ through contact 102, which acts on the p-n junction 110 of a second section of the diode 100. The second section of diode 100 may be defined by a length of p-n junction 110 effected by current $I_2$, which depends on the size and position of contact 102. While shown as two separate current sources 111 and 112, the power source to contacts 101 and 102 may be a single power supply with filters that separately control the phase difference of current at contacts 101 and 102.

Figure 3:
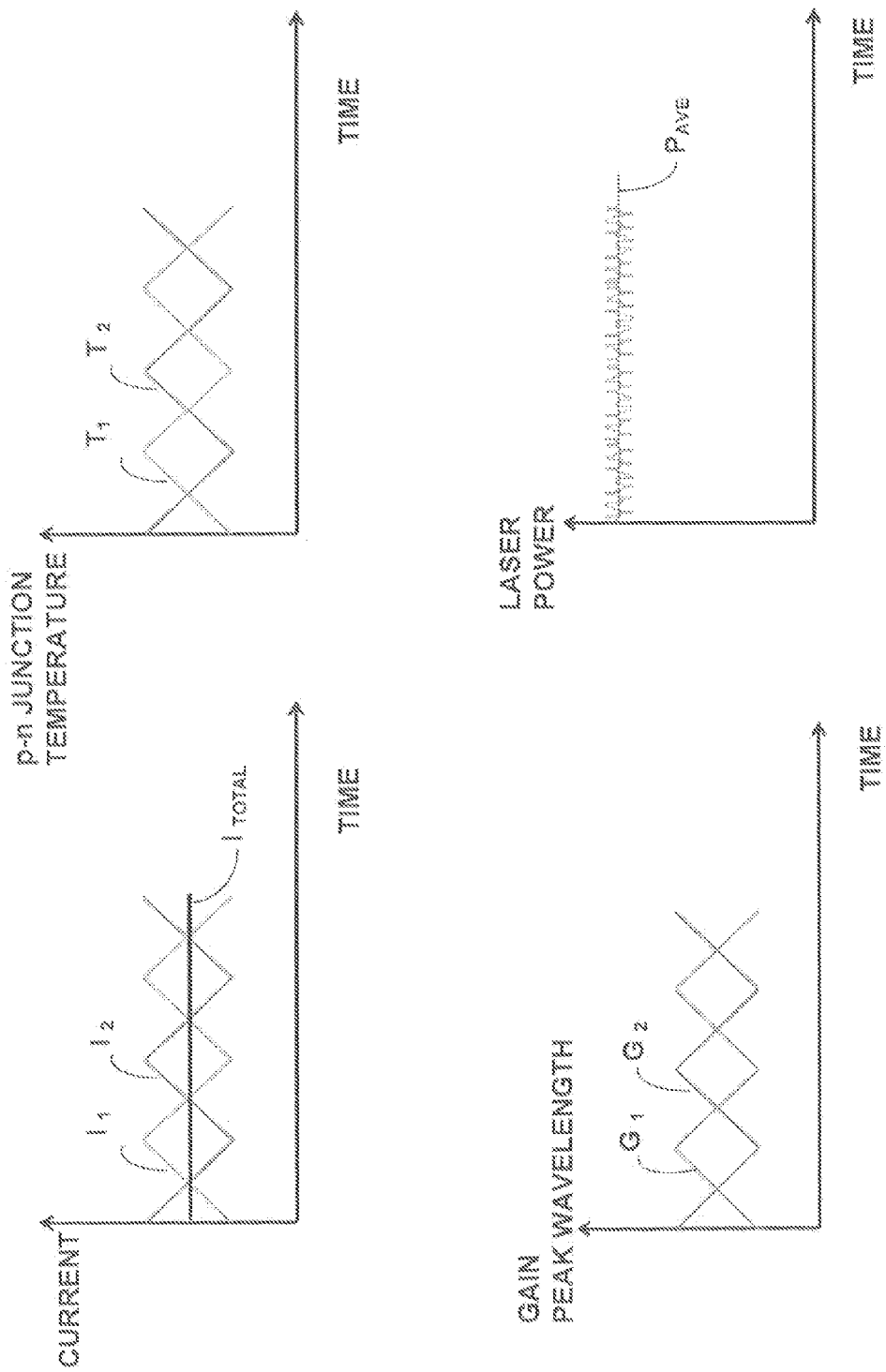
FIG. 3 shows an example graphical illustration of the dual current modulation.

FIG. 3 shows a graphical illustration of the currents $I_1$ and $I_2$ that are generated by current sources 111 and 112. As shown, currents $I_1$ and $I_2$ are triangular waves in antiphase (i.e., having a phase difference=$\pi$). Alternatively, the phase difference between current $I_1$ and current $I_2$ may be about $\pi$. By providing current $I_1$ and $I_2$ modulated with such a phase offset, the total laser current $I_{TOTAL}$ may be maintained at constant level as shown in FIG. 3.

The localized change of current density (i.e., the two current waves for $I_1$ and $I_2$ shown in FIG. 3) may lead to a corresponding local p-n junction temperature changes $T_1$ and $T_2$ in diode 100 in the first and second sections of diode 120, as shown in FIG. 3. In response to the localized temperature changes, a corresponding shifting in wavelength of peak gain $G_1$ and $G_2$ for the first and second sections of the laser diode 120 may result. The shifting positions of $G_1$ and $G_2$ provide additional opportunities for the laser mode to shift. If modulation frequency for currents $I_1$ and $I_2$ is high enough, the laser diode 100 may experience multiple mode-hops during a single recording pulse, and effects of separate hops can be averaged over time, which results in reduced laser noise. Hence, as a result of the modulated currents $I_1$ and $I_2$, the average laser output power $P_{ave}$ is substantially constant over a duration of multiple laser mode hops as shown in FIG. 3. While triangular current modulation $I_1$ and $I_2$ is depicted in FIG. 3, it should be noted that other current modulation wave shapes may be generated within the scope of the described embodiments.

Because total power may be maintained at a constant level, the modulation rate of currents $I_1$ and $I_2$ may be approximately equal to the recording rate of the write head on the EAMR device. However, it is not necessary for the current modulation currents $I_1$ and $I_2$ to be synchronized with the write (i.e., recording) pulses. Alternatively, the modulation rate for currents $I_1$ and $I_2$ may be lower than the rate of the recording pulses.

Figure 4:
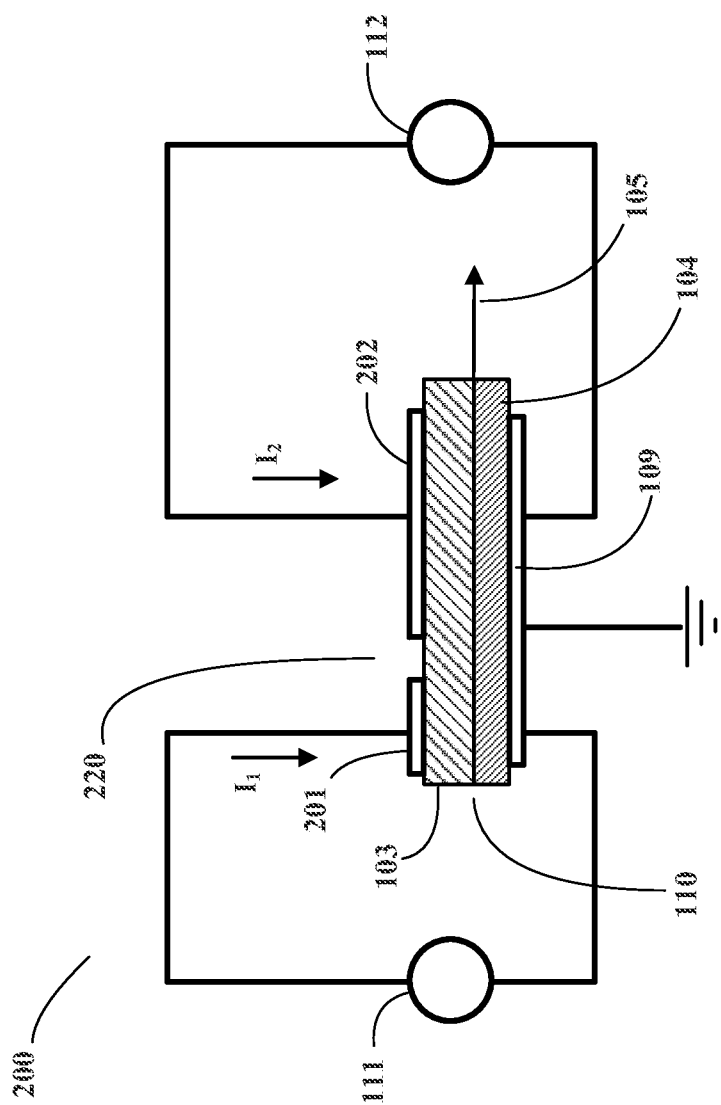
FIG. 4 shows an exemplary variation to the embodiment of a laser diode shown in FIG. 1, in which the two contact sections are asymmetrical.

FIG. 4 shows a diagram of an exemplary laser diode apparatus 200, which is a variation of the laser diode apparatus 100 shown in FIG. 2. In FIG. 4, contact 201 is smaller than contact 202, which alters the p-n junction temperature effect across diode 220. Contact 201 is disposed along a surface of a first section of diode 220 having less surface area than a second section of diode 220, on which contact 202 is disposed. Current modulation source 111 drives a current $I_1$ through contact 201, which acts on the p-n junction of the first section of the diode 220. Current modulation source 112 drives a current $I_2$ through contact 202, which acts on the p-n junction of the second section of the diode 220. The laser diode 220 includes a p-type semiconductor 103 and an n-type semiconductor 104, with laser output 105 transmitted longitudinally from the p-n junction. For the embodiment shown in FIG. 4, with diode 220 having contact sections 201 and 202 with different sizes, the lasing mode position may be defined by the local temperature as controlled by the larger contact 202 on the longer second section of diode 220.

Figure 5:
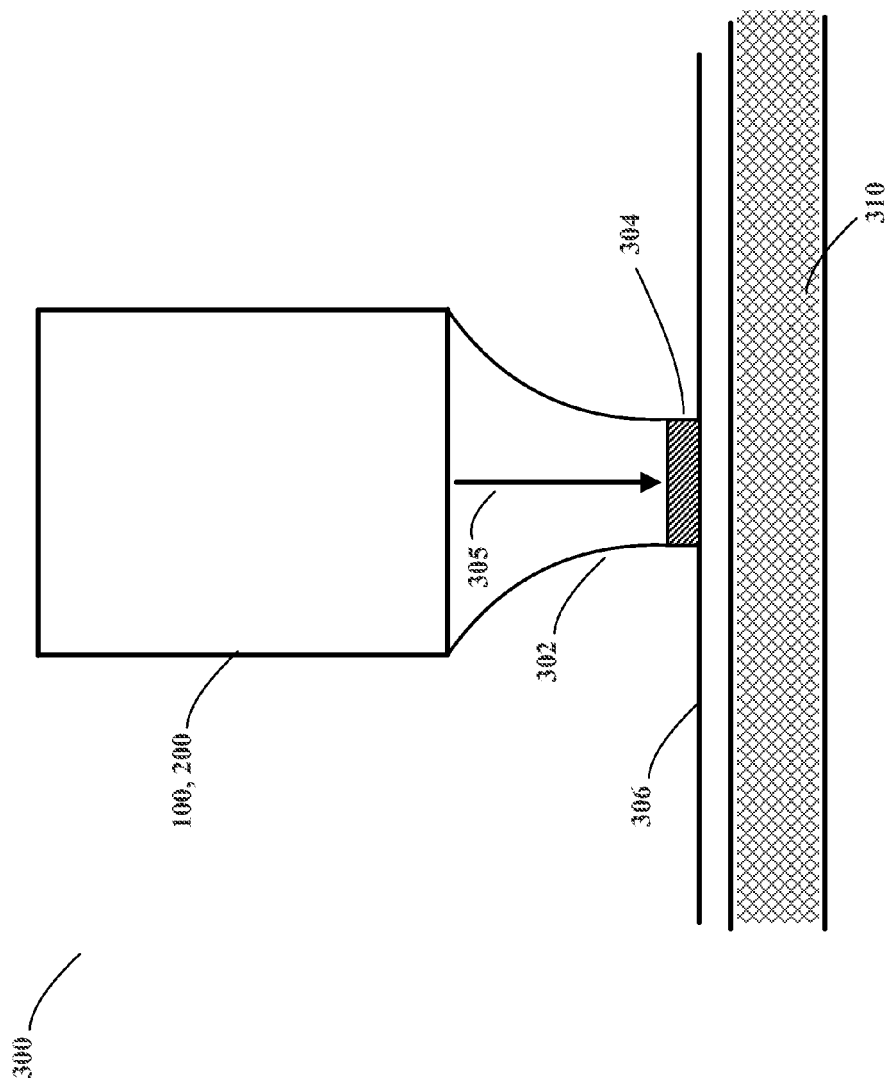
FIG. 5 shows a block diagram of an exemplary implementation of a current modulated laser diode.

FIG. 5 shows a diagram of an exemplary embodiment for a laser diode apparatus 300 which may implement the current modulated laser diode apparatus 100, 200. As shown, the laser diode apparatus 100, 200 may be coupled to a waveguide 302 for directing the laser 305 to a near field transducer (NFT) 304 mounted at an air bearing surface 306 of a magnetic recording device, e.g., an EAMR device. As the writer head of the EAMR device performs the magnetic recording at the desired information track of the storage disk 310, the laser diode apparatus coupled to the NFT 304 supplies the laser 305 for magnetic softening of a nano-sized bit space on the storage disk 310. The various aspects of this disclosure are provided to enable one of ordinary skill in the art to practice the present invention.

Various modifications to exemplary embodiments presented throughout this disclosure will be readily apparent to those skilled in the art, and the concepts disclosed herein may be extended to other devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112(f) unless the element is expressly recited using the phrase "means for" or, in the case of a method claim, the element is recited using the phrase "step for."

What is claimed is:
1. An apparatus, comprising:
   a laser diode having a p-n junction comprising a first section and a second section;
   a first contact coupled to the first section and a second contact coupled to the second section;

a near field transducer configured to direct light emitted from the laser diode to a magnetic recording medium; and a power source configured to provide a first modulated current to the first contact across the first section of the p-n junction and a second modulated current to the second contact across the second section of the p-n junction, wherein the first modulated current and the second modulated current have a phase difference.

2. The apparatus of claim 1, wherein the power source is further configured to provide the first and second modulated currents to the laser diode to provide localized control of temperature along the p-n junction.

3. The apparatus of claim 1, wherein the phase difference is about $\pi$.

4. The apparatus of claim 1, wherein the power source is further configured to provide the first and second modulated currents such that average laser output power is substantially constant over a duration of multiple laser mode-hops.

5. The apparatus of claim 4, wherein the average laser output is averaged with respect to a magnetic recording period.

6. The apparatus of claim 1, wherein the first contact and the second contact are of substantially equal size.

7. The apparatus of claim 1, wherein the first contact is larger than the second contact for controlling a longitudinal lasing mode position of the laser diode by controlling a local temperature in a first section of the laser diode.

8. The apparatus of claim 1, further comprising a magnetic recording device configured to perform write operations at a recording frequency, wherein the frequency of the current modulation is less than or equal to the recording frequency.

9. A data storage device, comprising:
a magnetic storage disk;
a laser diode having a p-n junction comprising a first section and a second section;
a first contact coupled to the first section and a second contact coupled to the second section;
a near field transducer configured to direct light emitted from the laser diode to the magnetic storage disk; and
a power source configured to provide a first modulated current to the first contact across the first section of the p-n junction and a second modulated current to the second contact across the second section of the p-n junction, wherein the first modulated current and the second modulated current have a phase difference.

10. The device of claim 9, wherein the power source is further configured to provide the first and second modulated currents to the laser diode to provide localized control of temperature along the p-n junction.

11. The device of claim 9, wherein the phase difference is about $\pi$.

12. The device of claim 9, wherein the power source is further configured to provide the first and second modulated current such that average laser output power is substantially constant over a duration of multiple laser mode-hops.

13. The device of claim 12, wherein the average laser output is averaged with respect to a magnetic recording period.

14. The device of claim 9, wherein the first contact and the second contact are of substantially equal size.

15. The device of claim 9, wherein the first contact is larger than the second contact for controlling a longitudinal lasing mode position of the laser diode by controlling a local temperature in a first section of the laser diode.

16. The device of claim 9, further comprising a magnetic recording device configured to perform write operations at a recording frequency, wherein the frequency of the current modulation is less than or equal to the recording frequency.

* * * * *